United States Patent
Ryu

(10) Patent No.: US 7,843,746 B2
(45) Date of Patent: Nov. 30, 2010

(54) METHOD AND DEVICE FOR REDUNDANCY REPLACEMENT IN SEMICONDUCTOR DEVICES USING A MULTIPLEXER

(75) Inventor: Hoon Ryu, Cary, NC (US)

(73) Assignee: Qimonda AG, München (DE)

( * ) Notice: Subject to any disclaimer, the term of this patent is extended or adjusted under 35 U.S.C. 154(b) by 332 days.

(21) Appl. No.: 12/003,701

(22) Filed: Dec. 31, 2007

(65) Prior Publication Data
US 2009/0168569 A1    Jul. 2, 2009

(51) Int. Cl.
*G11C 29/00* (2006.01)
*G11C 7/00* (2006.01)

(52) U.S. Cl. .................. 365/200; 714/710; 714/711

(58) Field of Classification Search ............ 365/200 O, 365/200; 714/710 X, 711 X, 710, 711
See application file for complete search history.

(56) References Cited

U.S. PATENT DOCUMENTS

| | | | | |
|---|---|---|---|---|
| 5,406,565 A | * | 4/1995 | MacDonald | 714/711 |
| 5,742,613 A | * | 4/1998 | MacDonald | 714/711 |
| 7,142,471 B2 | * | 11/2006 | Fasoli et al. | 365/200 |

* cited by examiner

*Primary Examiner*—VanThu Nguyen
(74) *Attorney, Agent, or Firm*—Coats & Bennett, P.L.L.C.

(57) ABSTRACT

A redundancy replacement scheme for a semiconductor device repairing a faulty memory cell in a column select line group with a spare memory cell in the column select line group based on a physical or logical address of the selected row.

5 Claims, 9 Drawing Sheets

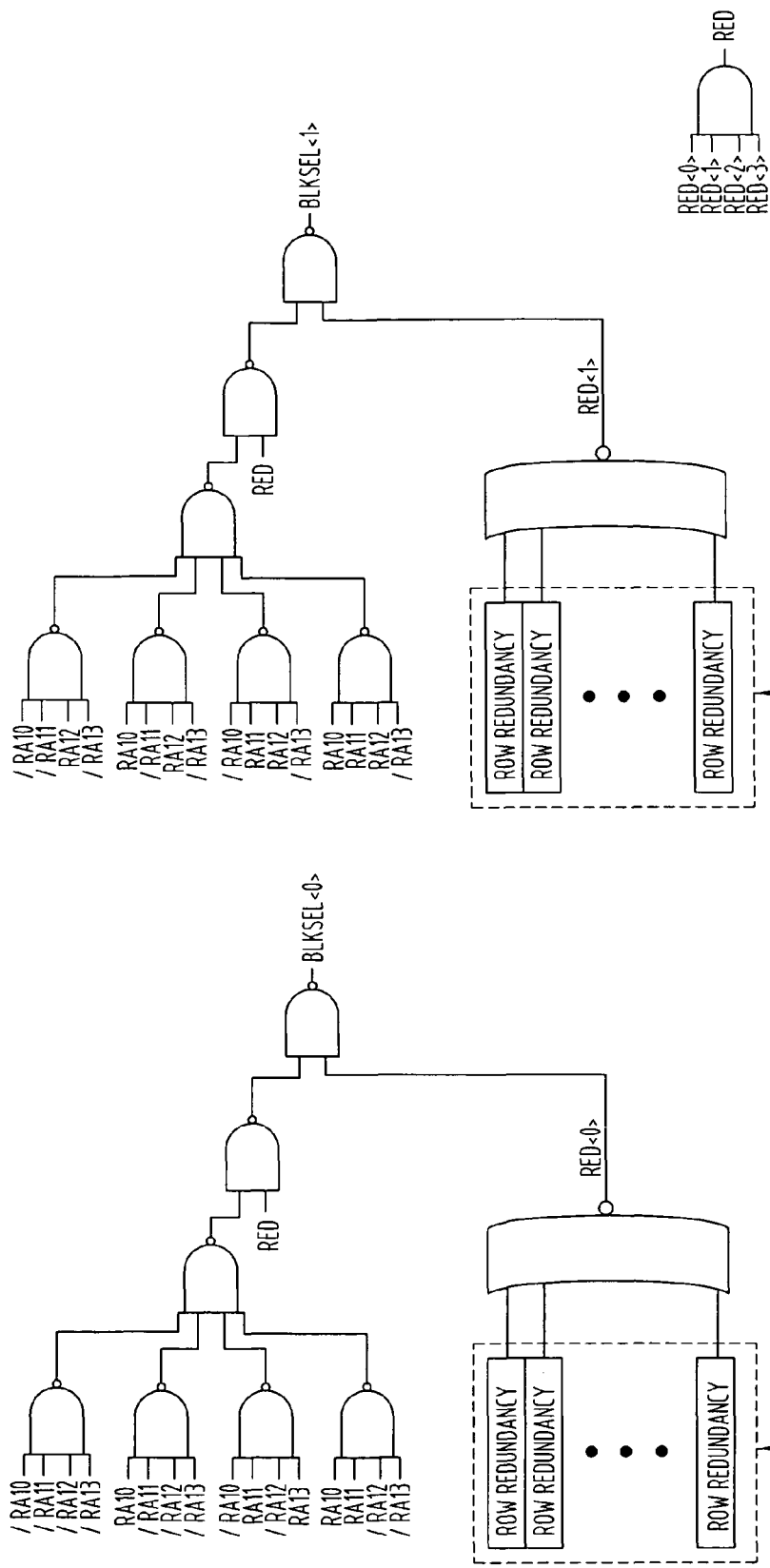

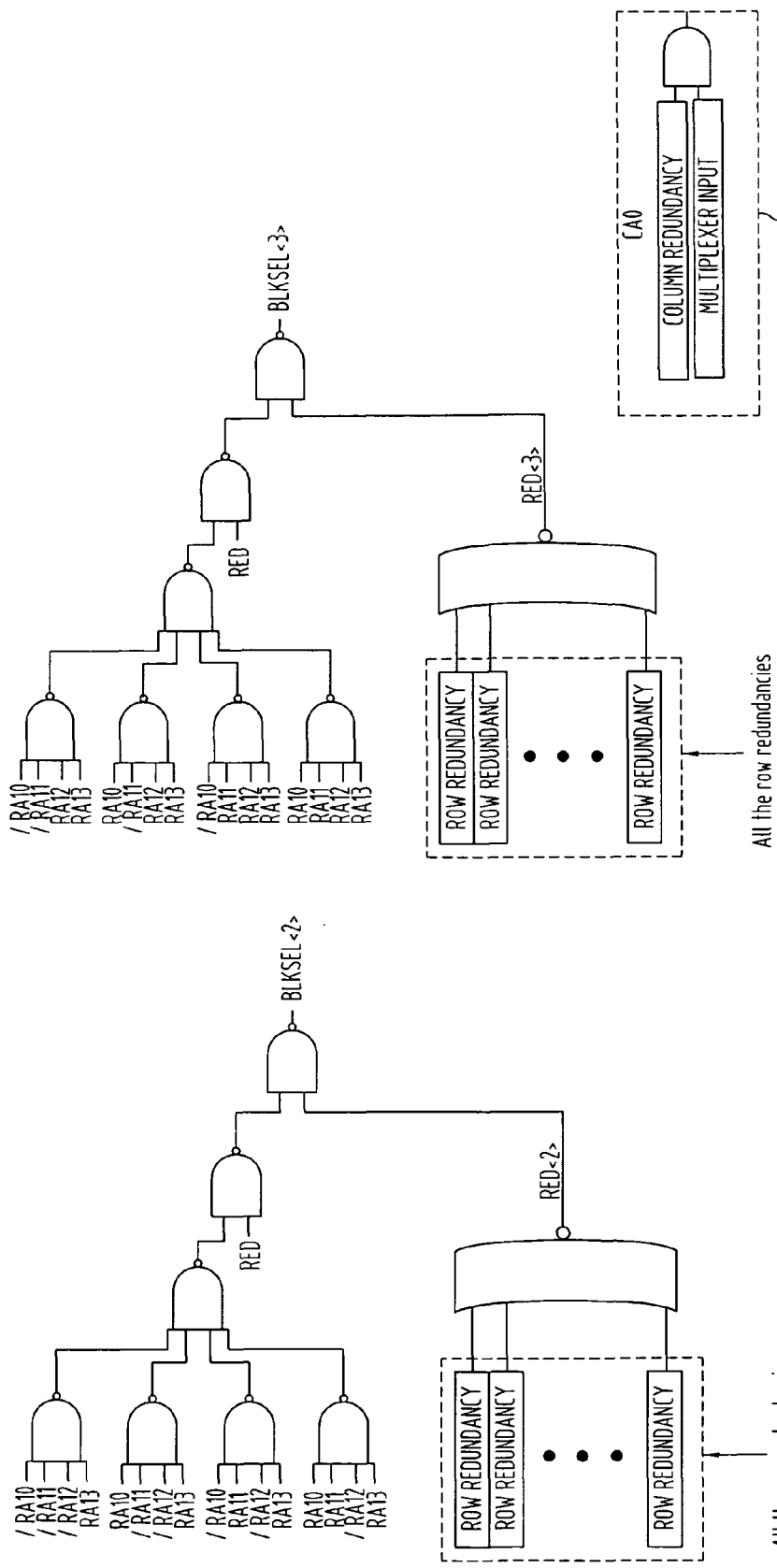

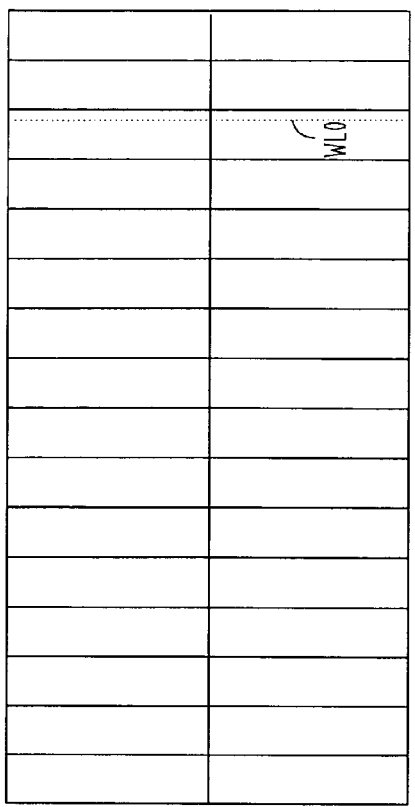
FIG. 6
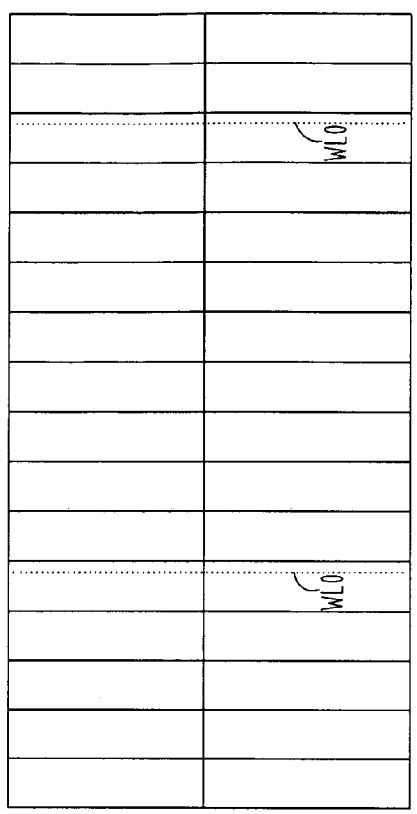
FIG. 7
FIG. 5

METHOD AND DEVICE FOR REDUNDANCY REPLACEMENT IN SEMICONDUCTOR DEVICES USING A MULTIPLEXER

BACKGROUND OF THE INVENTION

A memory cell array, such as a dynamic random access memory (DRAM) can be arranged in a row-column format by rows or word lines (WL) and columns or bit lines (BL). The memory cell array can be segmented by grouping the memory cells into areas of the memory array, and these memory areas can be addressed logically and/or physically. For example, a plurality of rows is combined together to form a row group, which can be addressed separately from another row group of a plurality of rows contained within the memory array. These groups of rows are commonly referred to as memory banks. A group of memory cells along a column can be segmented or separately addressed from another group of memory cells along the same column or column select line (CSL). These groups of memory cells within a column or column select line are referred to as column segments or column select line (CSL) segments.

Each memory cell is structured for storing digital information in the form of a "1" or a "0" bit. To write (i.e., store) a bit into a memory cell, a memory address having portions identifying the cell's row (the "row address") and column (the "column address") is provided to address circuitry in the semiconductor memory to activate the memory cell, and the bit is then supplied to the memory cell. Similarly, to read (i.e., retrieve) a bit from a memory cell, the memory cell is again activated using the cell's memory address, and the bit is then output from the memory cell.

When memory cells are arranged in groups of rows, which are typically called rows groups or blocks, the binary memory address can include a row group or block address. For example, if the memory contains a plurality of memory cells arranged together in a block or row group, the address can include bits identifying the block or row group in the memory cell array to be accessed.

Semiconductor memories are typically tested after they are fabricated to determine if they contain any failing or faulty memory cells (i.e., cells to which bits cannot be dependably written or from which bits cannot be dependably read). Generally, when a semiconductor memory is found to contain failing or bad memory cells, an attempt is made to repair the memory by replacing the failing memory cells with redundant memory cells provided in a redundant row or redundant word line (RWL), a redundant column or BL, and/or a redundant column select line segment (RCSLS).

When a redundant row is used to repair semiconductor memory containing a failing memory cell, the failing cell's row address is permanently stored (typically in predecoded form) within the semiconductor device on which the semiconductor memory is fabricated by programming a nonvolatile element (e.g., a group of fuses, antifuses, or FLASH memory cells) on the semiconductor device. Then, during normal operation of the semiconductor memory, if the memory's addressing circuitry receives a memory address including a row address that corresponds to the row address stored in the semiconductor device, redundant circuitry in the semiconductor device causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a column needs to be repaired in the semiconductor memory, the failing cell column is permanently stored (typically in predecoded form) on the semiconductor device by programming a nonvolatile element on the semiconductor device. Then, during normal operation of the semiconductor memory, if the memory's addressing circuitry receives a memory address including a column address that corresponds to the column address stored within the semiconductor device, redundant circuitry in the semiconductor device causes a redundant memory cell in the redundant column to be accessed instead of the memory cell data identified by the received memory address. As every memory cell in the failing memory cell's column has the same column address, every memory cell in the failing memory cell's column, both operative and failing, is replaced by a redundant memory cell in the redundant column.

The current redundancy schemes select the column select line repair region during row activation based on the row group address. If an addressed row needs to be replaced (i.e., it contains a bad or faulty memory cell), it can be replaced with a row within the same block or row group (i.e., intra-group repair) or outside the block or group (i.e., inter-group repair). If the column select line in the original row segment needs repair, a corresponding or identical column select line repair is made in the row group into which the defective row is replaced. The column select line replacement occurs whether or not the column select line in the new or redundant row group is defective. Alternatively, it is possible that the column select line in the original row group is operative while the column select line in the new or redundant row group is defective. Since the column select line repair region is determined by the row address of the row requiring repair, the defective column select line in the new row or redundant group will not be repaired, and therefore a fault will occur. This arrangement limits the repair options. For such reasons, the current redundancy scheme limits flexibility in repair.

As a result of the above-described replacement scheme, operative memory cells can be unnecessarily replaced, thereby reducing overall memory yield during production.

SUMMARY OF INVENTION

A redundancy replacement scheme for a semiconductor device repairing a faulty memory cell in a column select line group with a spare memory cell in the column select line group based on a physical or logical address of the selected row.

BRIEF DESCRIPTION OF THE DRAWINGS

The accompanying figures serve to illustrate various exemplary embodiments and to explain various principles and advantages in accordance with this application. In the accompanying figures, like reference numerals refer to identical or functionally similar elements, and the figures together with a detailed description set forth herein are incorporated in and form part of the specification.

FIGS. 3A to 3E include block diagrams showing parts of a row group decoder in accordance with an embodiment of this application.

FIG. 4 is a block diagram showing a portion of a column select line repair circuit in accordance with an embodiment of this application.

FIGS. 5 to 11 are block diagrams showing a replacement scheme for repairing representative different types of memory arrays, including double data rate DRAM operating in X4, X8, or X16 mode in accordance with different embodiments of this application.

DESCRIPTION OF THE PREFERRED EMBODIMENTS

The following exemplary embodiments and aspects thereof are described and illustrated in conjunction with structures and methods that are meant to be exemplary and illustrative, and not limiting in scope. In the following description, numerous specific details are set forth, such as representative memory addresses, to provide a thorough understanding of the present invention. However, it will be obvious to those skilled in the art that the embodiments described in this application can be practiced without such specific, but exemplary, details. In other embodiments, circuits have been shown in block diagram form in order not to obscure the embodiments described in this application in unnecessary detail. For the most part, details concerning timing considerations, the arrangement of sense amplifiers, transistors, storage capacitors, data lines and the like have been omitted inasmuch as such details are not necessary to obtain a complete understanding of the embodiments described in this application.

It is contemplated that memory repair schemes can be used to repair defective memory cells in dynamic random access memory (DRAM), including double data rate (DDR, DDR2) DRAM. However, the memory repair schemes described herein are also appropriate for use in synchronous DRAM (SDRAM), static random access memory (SRAM), as well as stand alone random access memory (RAM) and other types of memory devices.

The memory cells are arranged by row or word lines (WL) and columns or bit lines (BL). In this application, the terms "word line" or "WL" will be used interchangeably with the term "row." The term "column" or "column select line" is interchangeable with the expression "bit line" or "BL."

An embodiment of the present application is concerned with a row and column repair scheme in which the column repair is independent of row repair. This embodiment includes replacing column select line segments (CSLS) with redundant column select line segments (RCSLS) in a row group other than that containing a defective row.

In the redundant replacement schemes described in the embodiments of this application, the column select line repair region need not be selected based on the original row address, but is selected based on a selected signal of the row group actually used for row repair or replacement. The result is increased overall memory yield, because column select line repair is based on the physical or logical address of a row group address in a manner that maximizes the use of good or properly functioning memory cells.

Figure 1:
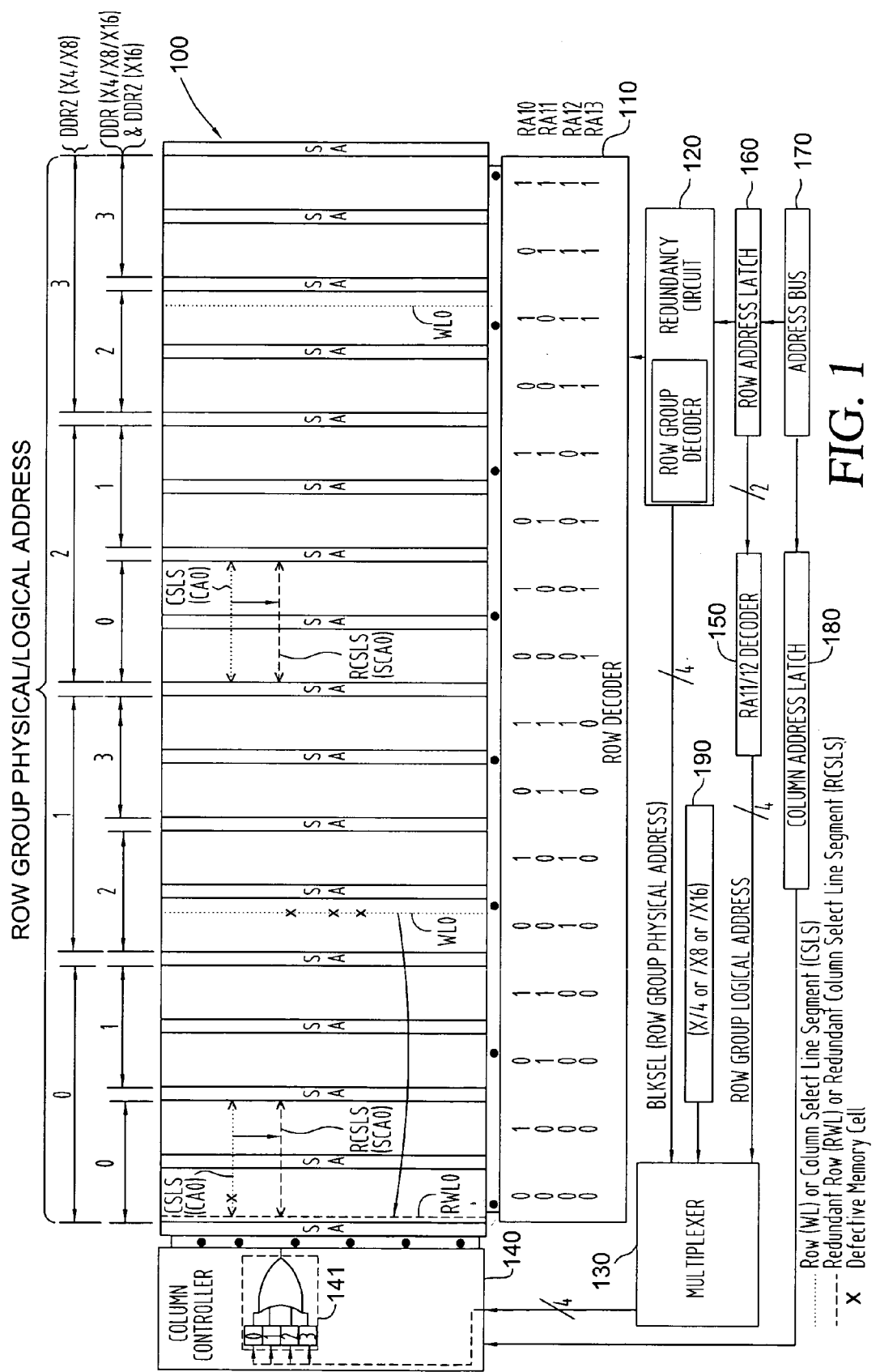
FIG. 1 is a universal block diagram showing a memory device including the replacement of defective memory cells within a memory array by an inter-group repair in accordance with embodiments of this application.

A memory array 100 may include rows that are represented by vertical lines in FIG. 1, and columns that are perpendicular to the rows and extend across the memory array horizontally. In FIG. 1, the vertically extending dotted lines represent a row, and the horizontally extending dotted lines represent a column select line. FIG. 1 shows two column select lines respectively extending across two row groups, which are identified by the "0" at the top of the figure under the heading "Row Group Physical/Logical Addresses" and along the horizontally extending double-headed arrows corresponding to the legend "DDR-X4/X8/X16 & DDR2-X16." FIG. 1 is a universal view of semiconductor memory devices and represents DDR and DDR2 DRAM operating in X4, X8, or X16 mode.

As understood by those skilled in the art, the abbreviations "X4," "X8," and "X16" in the top right portion of FIG. 1 correspond to typical operation modes of memory devices, such as DDR and DDR2 DRAM, and refer to the data width of the memory devices in bits. For example, the data width in X16 mode is twice that in X8 mode. Some operating modes address two rows of memory at the same time. FIG. 1 shows a mode of operation that includes addressing two rows of memory simultaneously. The operation mode of the memory device is embedded in the memory device by fusing or otherwise, as understood by those skilled in the art.

A plurality of memory cells individually connect to each of the rows and columns. The memory cells intersect at the crossover points of each of the rows and columns. Each "X" in FIG. 1 represents a bad memory cell located at an intersection or crossover point of a row and a column select line. The dotted lines in FIG. 1 represent a row or column select line contained normally addressable memory cells. The dotted lines having an X (bad memory cell) thereon represents a bad row or column select line, which needs to be replaced with a redundant row or a redundant column select line. The dashed lines in FIG. 1 represent a redundant row or a redundant column select line. FIG. 1 shows a small number of rows, redundant rows, column select lines, column select line segments and redundant column select line segments for ease of illustration and discussion. However, a larger number of rows, redundant rows, columns, column select line segments, and redundant column select line segments are included in a memory device, as understood by those skilled in the art, depending on the size and configuration of the memory array, as desired.

The row groups respectively include a plurality of rows and column select line segments (i.e., column segments). As shown in FIG. 1, the rows are grouped in blocks or row groups identified by the numbers 0, 1, 2, and 3 at the top of the figure, relative to the mode of operation, DDR2 (X4X8), DDR (X4/X8/X16), and DDR2 (X16), under the heading "Row Group Physical/Logical Address." FIG. 1 shows eight row groups for DDR-X4/X8/X16 and DDR2-X16. Typically, the row groups are addressed by a combination of row addresses, such as RA11, RA12, and RA13, which addresses are shown in the row decoder 110 in FIG. 1. The left-most row group has row addresses including (RA11=0, RA12=0, RA13=0), the next row group address includes (RA11=1, RA12=0, RA13=0), and so on across FIG. 1, as shown by 0's and 1's for the row addresses RA11, RA12, and RA13 in row decoder 110. The right-most row group includes the address (RA11=1, RA12=1, RA13=1). Depending, for example, on the operation mode of the memory device, a single row group or a combination of row groups can be addressed together.

The column select lines in the memory array extend horizontally and are divided or segmented, for example, by row groups 0, 1, 2, and 3 into column select line segments. For example, row group 1 is addressed by row addresses RA11=1 and RA12=0. In the embodiment shown in FIG. 1, the column select line segments have the column address CA0, and the redundant column select line segments have the redundant column address SCA0. FIG. 1 shows the column select line segment and redundant column select line segment end with arrowheads showing their boundaries within the corresponding columns in the memory array. For example, the dotted-line graphic "<••••••••••>" in FIG. 1 represents a column select line segment (CSLS), while the dashed-line graphic "<----->" shows a redundant column select line segment (RCSLS). The column select line segment (CA0) and row (WL0) on the right in FIG. 1 represents normally addressable units of memory cells. This column select line segment and row do not contain any bad memory cells X. The areas in FIG. 1 adjacent the column select line segments and rows (CSLS, WL0) contain normally addressable units of memory cells arranged by rows and column select lines, which provide additional normally addressable memory cells. FIG. 1 does not show the additional memory cells in these adjacent areas for ease of illustration.

A defective row containing a defective or failing memory cell X, such as WL0 shown on the left in FIG. 1, can be replaced by spare elements (i.e., redundant row) either within the same row group or in any other row group. The replacement of a row in the same row group (i.e., row group 0, 1, 2, or 3) is an intra-group (intra-block) repair, while a replacement between different row groups is termed an inter-group (inter-block) repair. The curved horizontally extending arrow in FIG. 1 that extends between WL0 and RWL0 shows an inter-group repair. Fuses (not shown) programmed during production tests determine which replacement scheme is to be used. Replacing or remapping the defective row line with a redundant row prevents the computer from accessing the defective memory cell X.

Figure 2:
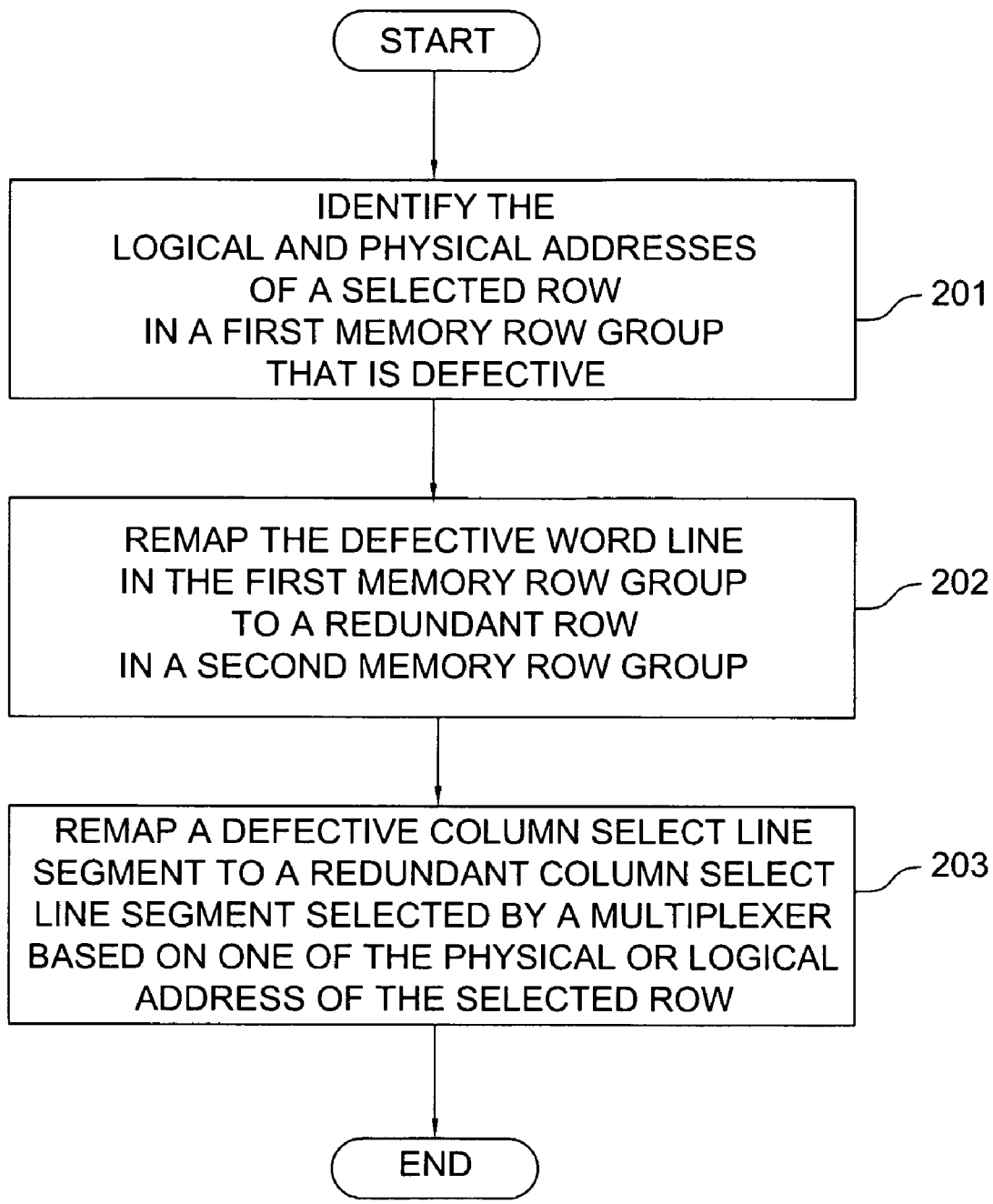
FIG. 2 is a flow diagram illustrating a procedure for repairing a memory array in accordance with an embodiment of this application.

FIG. 2 includes a flow diagram illustrating a procedure for repairing a memory array according to an embodiment of this application. The procedure starts by receiving a memory address along an address bus. Step 201 identifies the logical and physical addresses of a selected row that is defective. An example of identifying the logical and physical addresses of a selected and defective row is comparing the logical and physical address of the selected row with addresses of rows stored in a register that are known to be defective. Remapping or replacing the defective row in the first row group, as identified in 401, with a redundant row in a second row group occurs in 402. Step 403 includes remapping a defective column select line to a redundant column select line. For example, the remapped column select line is selected in part by a multiplexer based on the one of the physical or logical address of the selected and defective row. In 404, the remapping or repairing of a defective column select line in the second row group with a redundant column select line in the second row group is based on the physical or logical address of the second row group, as identified by the multiplexer. The procedure then ends.

A decoupled inter-group repaired is shown for the semiconductor memory device 100 of FIG. 1 and includes a feature in that the multiplexer 130 receives both a row group physical address from redundancy circuit 120 and a row group logical address from RA11/12 decoder 150. The row address latch 160 and the column address latch 180 receive a memory address from an address bus 170. The memory address includes a row group address that identifies a row group, a row address that identifies a row, a column address that identifies a column, etc. The column address latch 180 receives the memory address from the address 170 and feeds the column address to the column controller 140. The row address latch 160 receives the memory address from the address latch 170 and feeds the row group address and the row address to the redundancy circuit 120, which feeds the decoded row and row group address to the row decoder 110. The row address latch 160 also separately feeds the RA11 and RA12 addresses to the RA11/RA12 decoder 150. A combination of row addresses, e.g., RA11 and RA12 as shown in FIG. 1, can address or identify the row group address. The RA11/RA12 decoder 150 decodes the RA11 and RA12 addresses and feeds the row group logical address to the multiplexer 130 via four lines, one for each of row group addresses 0, 1, 2, and 3.

The redundancy circuit 120 includes a row group decoder, which contains a plurality of individual row group decoders, such as shown in FIGS. 3A, 3B, 3C, and 3D. The individual row group decoders respectively decode the redundancy for each of the row groups 0, 1, 2, and 3, based on the redundancies of all the rows in the respective row group having, for example, physical address 0, 1, 2, or 3, and the addresses RA10, RA11, RA12, RA13. The forward slanting diagonal line ("/") in FIGS. 3A, 3B, 3C, and 3D corresponds to the inverted signal. For example, "/RA10" is the inverted signal of "RA10." Thus, if RA10 is high, then /RA10 is low and vice versa. The RED shown in FIG. 3E corresponds to the RED input for one of the NAND gates in each of FIGS. 3A, 3B, 3C, and 3D. The individual row group decoders decode a received row address with addresses stored in each of the row redundancies (e.g., storage device) in the corresponding physical row group address (e.g., row group of physical address 0 in FIG. 3A). The individual row group decoders output a block select signal (BLKSEL) identifying redundancy, when any of the rows in the respective row group are defective. The redundancy circuit 120 sends the decoded row group address and row address to the row decoder 110, which redirects memory access to the redundant unit in the event redundancy is present. FIG. 1 shows a redundancy where the address for the defective row WL0 is remapped to redundant row RWL0. The row redundancies within the redundancy circuit 120 and redundancies elsewhere in the memory device can be nonvolatile storage device, such as a plurality of fuses, antifuses, or FLASH memory cells that store the row addresses corresponding to a defective row.

The multiplexer 130 receives the row group physical address from the redundancy circuit 120 and the row group logical address from the RA11/RA12 decoder 150. The multiplexer 130 also receives a signal from the semiconductor memory device identifying the operation mode (e.g., X4, X8, or X16) of the semiconductor memory device. Based on the received signals, the multiplexer 130 selects the appropriate BLKSEL signal for each row group depending on whether redundancy exits, and send the selected BLKSEL signal to the column controller 140. The multiplexer 130 sends a separate signal to the column controller 140 for each row group, for example, four separate signals in four separate lines in this embodiment. Each of the four separate signals can correspond respectively to one of the four groups of column select line segments (e.g., CA0, CA1, CA2, and CA3) according to the memory device shown in FIG. 1. The multiplexer 130 receives a signal from the memory device concerning the data width or operating mode (e.g., X4, X8, or X16). In such a manner, the multiplex can make a selection of the column select lines based on the column page depth.

The multiplexer 130 supplies separate signals to each of the individual column comparison units 0, 1, 2, and 3 of the CSLS repair circuit 141, which are contained in the column controller 140. The designations 0, 1, 2, and 3 for the individual column comparison units respectively correspond to column select line segment addresses CA0, CA1, CA2, and CA3. As shown in FIG. 4, each column comparison unit CA0, CA1, CA2, and CA3 includes an AND gate with an input from the multiplexer 130 and a column redundancy. The CSLS repair circuit 141 can include a plurality of fuse elements or other nonvolatile storage unit for the column redundancy, and store the column addresses (typically in normal or precoded form) corresponding to a defective CSLS according to whether or not these fuses are blown.

The column address latch supplies the physical (or original) row group address and the column address to the column controller 140. Each of the individual column repair units CA0, CA1, CA2, and CA3 compares the signal received from the multiplexer to the column redundancy for the corresponding column select line segment (i.e., CA0, CA1, CA2, and CA3), as shown in FIG. 4. When the originally addressed column select line segment contains a defective memory cell (redundancy detected), the column controller 141 activates a redundant column select line (e.g., SCA0). For DDR DRAM operating in X4/X8/X16 mode and for DDR2 DRAM operating in X4/X8 mode, the redundant column select line segments (RCSLS) are activated in pairs, namely, two redundant column select line segments (e.g., SCA0) are activated, as shown in the example illustrated in FIG. 1. In this embodiment, the column select line repair is decoupled (separated) from the row repair. This arrangement can be termed a "decoupled inter-group repair." This arrangement incurs no timing penalty, since the tRCD (row (WL) address to column address delay) is sufficiently long to transmit the decoded row group information into the multiplexer 130 and the column select line repair region to the column controller 140.

In the case of an inter-group row repair, the use of interdependent row group and column select line addresses can result in errors. This can happen when a row replacement utilizes a redundant row in another row group, and a column select line segment replacement is also required in the other row group. For example, when making a repair for a row group (i.e., row group 2), the column select line repair region is based on the row group address and is active only for that row group (i.e., row group 2). If the redundant row and thus active row is in row group 0 (i.e., by remapping or repair), a column select line replacement in row group 0 cannot replace adequately the defective column select line segment in row group 2. In other words, the column select line repair will not take place when the row and column select line repairs are interrelated or the addresses used therewith are interrelated. This is because the prior art semiconductor memory circuitry does not decode a match in row group 0. This will cause fails that appear to be in row group 2.

In other words, during a combined row and column select line interdependent repair, a defective row (i.e., the left WL0 as shown in FIG. 1) is repaired via an inter-group repair from one row group into another row group (i.e., from row group 2 into row group 0, as shown by the curved horizontally extending arrow in FIG. 1). In this situation, if a defective column select line existed in row group 0 containing RWL0 (not shown), the column select line repair would also take place in group 0, which corresponds to the logically defective column select line. This type of repair can cause the spare or redundant column select line to become activated in group 0 even when the original column select line in group 2 was passing (good). Also, in such an interdependent repair, the entire memory will fail if the spare or redundant column select line in row group 2 has a fail.

For example, assuming that a column select line repair was necessary for a column select line segment in row group 2 and the column select line repair is based on the physical row group address for row group 2. An interdependent repair will cause the column select line replacement identified to occur in row group 0, resembling the downward arrow in row group 0 (CA0 to SCA0). However, if a memory cell associated with the spare or redundant column select line was defective or faulty, the memory would fail. On the other hand, if the corresponding memory cell in a column select line segment in row group 2 was a good or properly functioning memory cell, the column select line replacement would not be necessary. Such an interdependent repair or replacement would defeat the function of replacing bad or faulty memory cells with good or properly functioning memory cells and prohibit the use of the redundant column select line segment (e.g., SCA0) for another column select line repair, thereby limiting yield.

A flexible row/column select line repair scheme according to an embodiment of this application provides for effective row repair via an inter-group repair. In this flexible inter-group repair, a bad row (WL0) is replaced with redundant or spare row (RWL0). In addition, any column select line segment repairs necessary in the redundant or spare row group area (group 0) will be based on the fact that the active (physical) row needing repair is in row group 2, rather than the fact that the logical address for WL0 is in row group 2. With the arrangement according to this embodiment of the application, no precaution is needed when deriving the repair solution and the repair flexibility is not limited.

In the decoupled inter-group repair according to an embodiment of this application, a defective row in a first row group (first memory block) is repaired with a redundant row in a second row group (second memory block). Since the row group address associated with the defective row is effectively decoded, a decoded row segment address is used for column select line segment repair in the second row segment. The repair is decoupled in that the row group address is effectively decoded, and the decoded address is used for column select line segment repair. In contrast, in the interdependent repair an address received by the memory is used for redundancy repair based on the initial relationship between the row group address, row address and column address of the address received. Namely, in the interdependent repair the redundancy repair in the second row group is based on the initial (logical) address of the first row group, not the physical (decoded) address of the second row group as described herein for the decoupled inter-group repair.

FIGS. 5-11 show additional embodiments of this application. FIGS. 5-7 show redundancy replacement schemes for exemplary semiconductor memory devices. FIG. 5 is a representation of DDR DRAM operating in X4, X8, or X16 mode. FIG. 7 is a representation of DDR2 DRAM operating in X16 mode. As shown in FIGS. 5 and 7, a read or write request for the address WL0 will activate two rows (both labeled WL0) simultaneously. FIG. 6 is a representation of DDR2 DRAM operating in X4 or X8 mode. FIG. 6 shows that with this type of semiconductor memory device, a read or write request for the address WL0 will activate a single row.

FIGS. 8-11 show embodiments of decoupled inter-group replacements schemes of this application that can employ the additional structure shown in FIG. 1, including the row decoder 110, redundancy circuit 120, multiplexer or 130, column controller 141, etc. While FIG. 8 does not show this addition structure from FIG. 1 for brevity, FIG. 8 includes a more detailed view of the row and column select segment line segment replacement for DDR2 DRAM operating in X16 mode. A read request activates two rows (WL0) simultaneously. The row (WL0) on the left contains bad memory cells (X). Based on the row redundancy contained within the row decoder 110, the row (WL0) on the left is replaced with row (RWL0) as shown by the right to left arrow in the figure. The row (WL0) on the right does not contain any bad memory cells, and therefore no replacement is made. The semiconductor memory device shown in FIG. 8 contains a column select line segment (CA0) in the first row group 0 at the left of the figure, which column select line segment contains bad memory cells (X). Based on signals from the column address latch 170, multiplexer 130 and column redundancy comparison 141, etc.; the column controller 140 replaces both column segment line segments with the address CA0 with redundant column segment line segments with the address SCA0.

Figure 8:
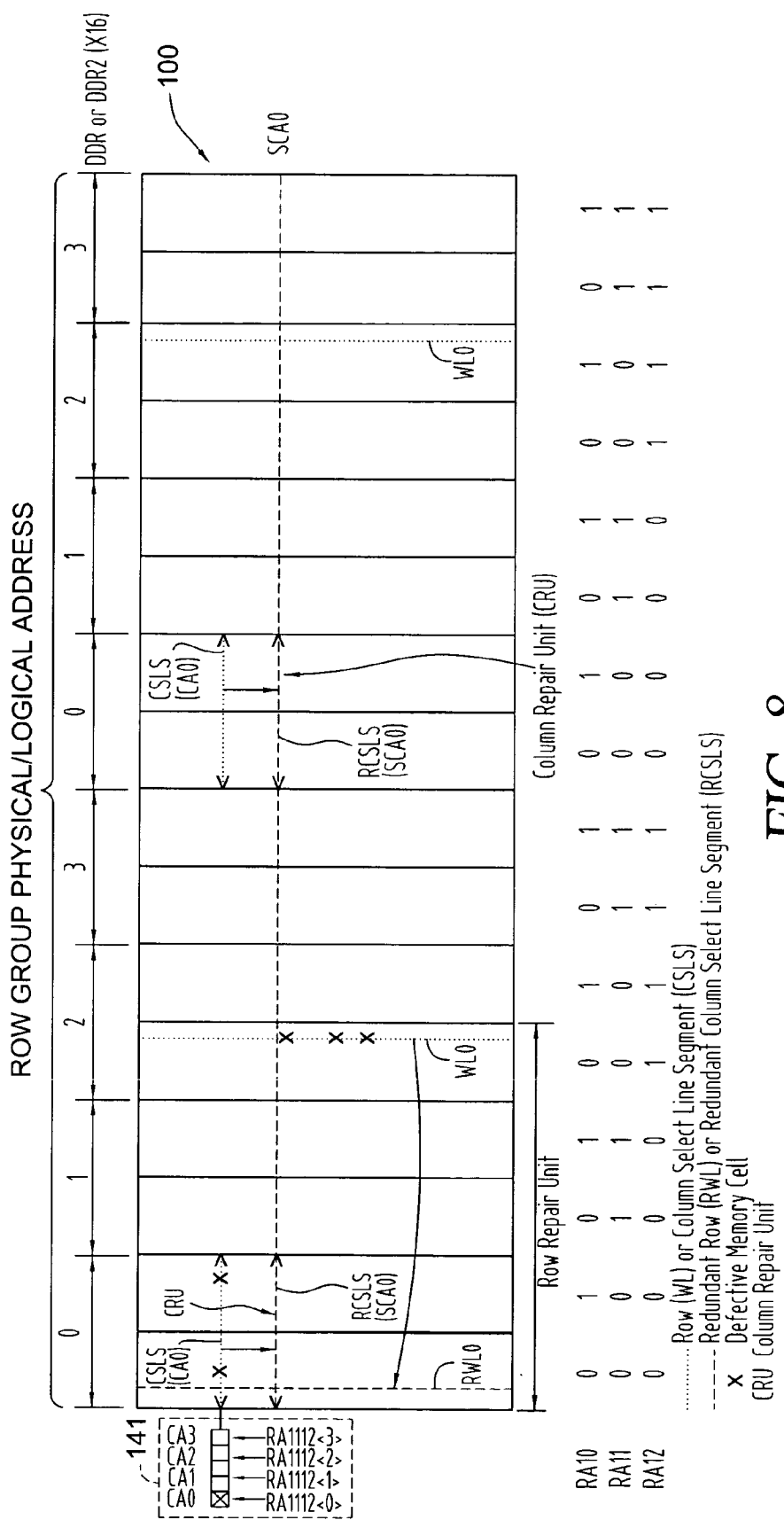

FIGS. 8 to 11 show a CSLS repair circuit 141 having four boxes representing the addresses for column select line segments CA0, CA1, CA2, and CA3. Each of these boxes receives a signal from the multiplexer 130 identifying redundancy in the row groups 0, 1, 2, and 3, which is represented by the expressions RA1112<0>, RA1112<1>, RA1112<2>, and RA1112<3>. The bottom of FIG. 8 shows the addresses for RA11, RA12, and RA13. For example, the expression RA112<0>corresponds to the row group 0, where RA11=0 and RA12=0. The multiplexer 130 decodes or determines redundancy for addresses for RA11 and RA12 and feeds the result to the CSLS repair circuit 141. When redundancy exists for the addressed column select line, the CSLS repair circuit 141 replaces the column address for the column select line segment (i.e., CA0) with a redundant column select line segment (i.e., RCA0). In the arrangement shown in FIG. 8, the column select line segments are replaced in pairs because two row group segments contained the same address (e.g., RA11=0 and RA12=0).

Figure 9:
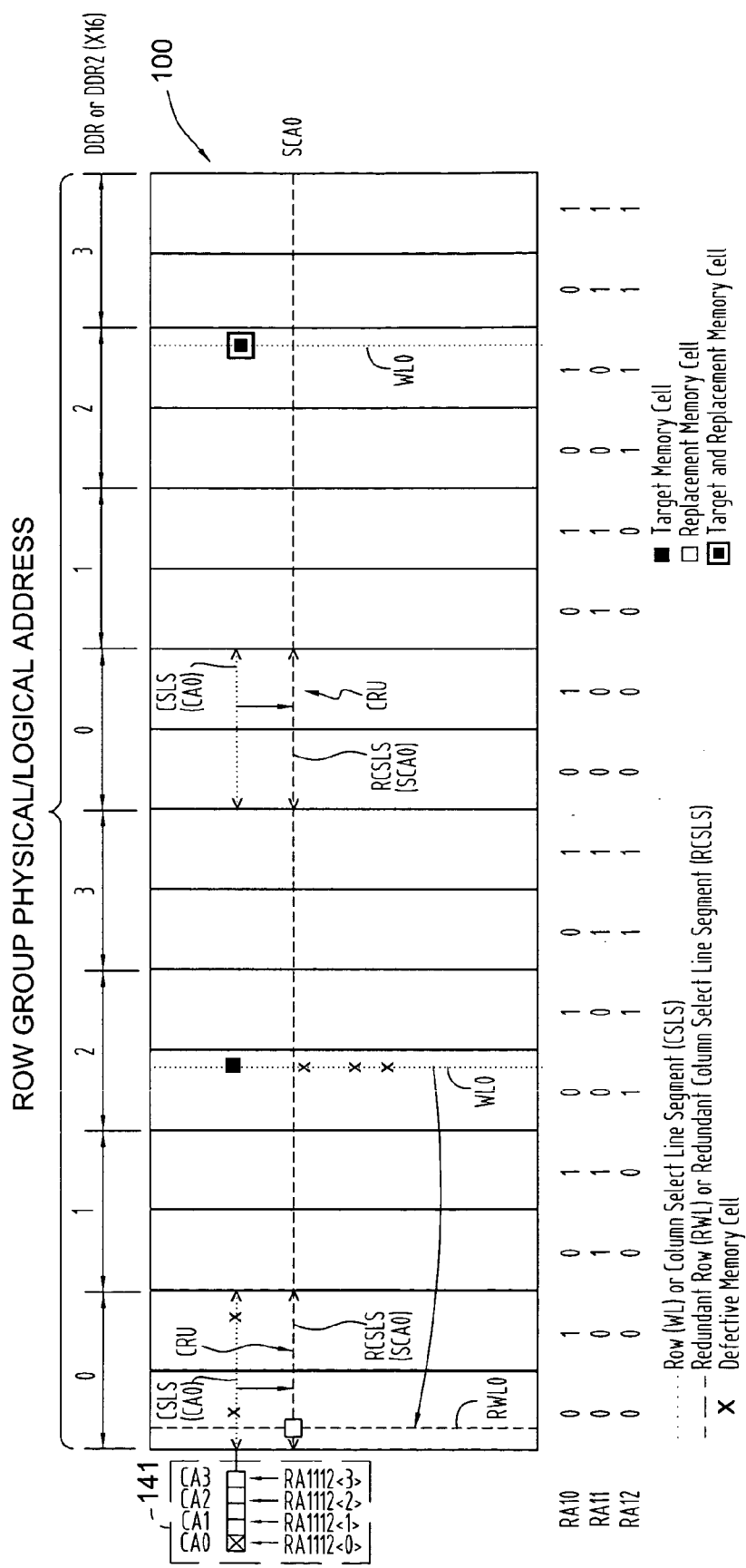

FIG. 9 shows a similar replacement scheme to that shown in FIG. 8. FIG. 9 shows a single bad row together with a single bad column select line segment with column address CA0 in row group 1. FIG. 9 further shows a target memory cell ("■"), a replacement memory cell ("□"), and a memory cell ("▣") were the target and replacement memory cell are the same memory cell. The address for the target memory cell (■) is contained within row (WL0) of physical row group 2. The left row (WL0) of physical row group 2, which contains the target memory cell (■), contains bad memory cells. Accordingly, the memory device remaps the left WL0 to redundant row (RWL0) as shown by the left to right arrow. However, the column select line segment with the address (CA0) also contains bad memory cells. Accordingly, the memory device remaps the column select line segment (CA0) to redundant column select line segment (SCA0). By these two re-mappings or replacements, the target memory cell (■) in row group 2 with row address WL0 and column address CA0 is replaced with the replacement memory cell (□) in row group 0 with row address RWL0 and column address RCA0. On the other hand, the memory cell in row group 2 on the right, which also has row address WL0 and column address CA0, is not replaced or remapped because it is not located in a row or column select line containing a bad memory cell.

Figure 10:
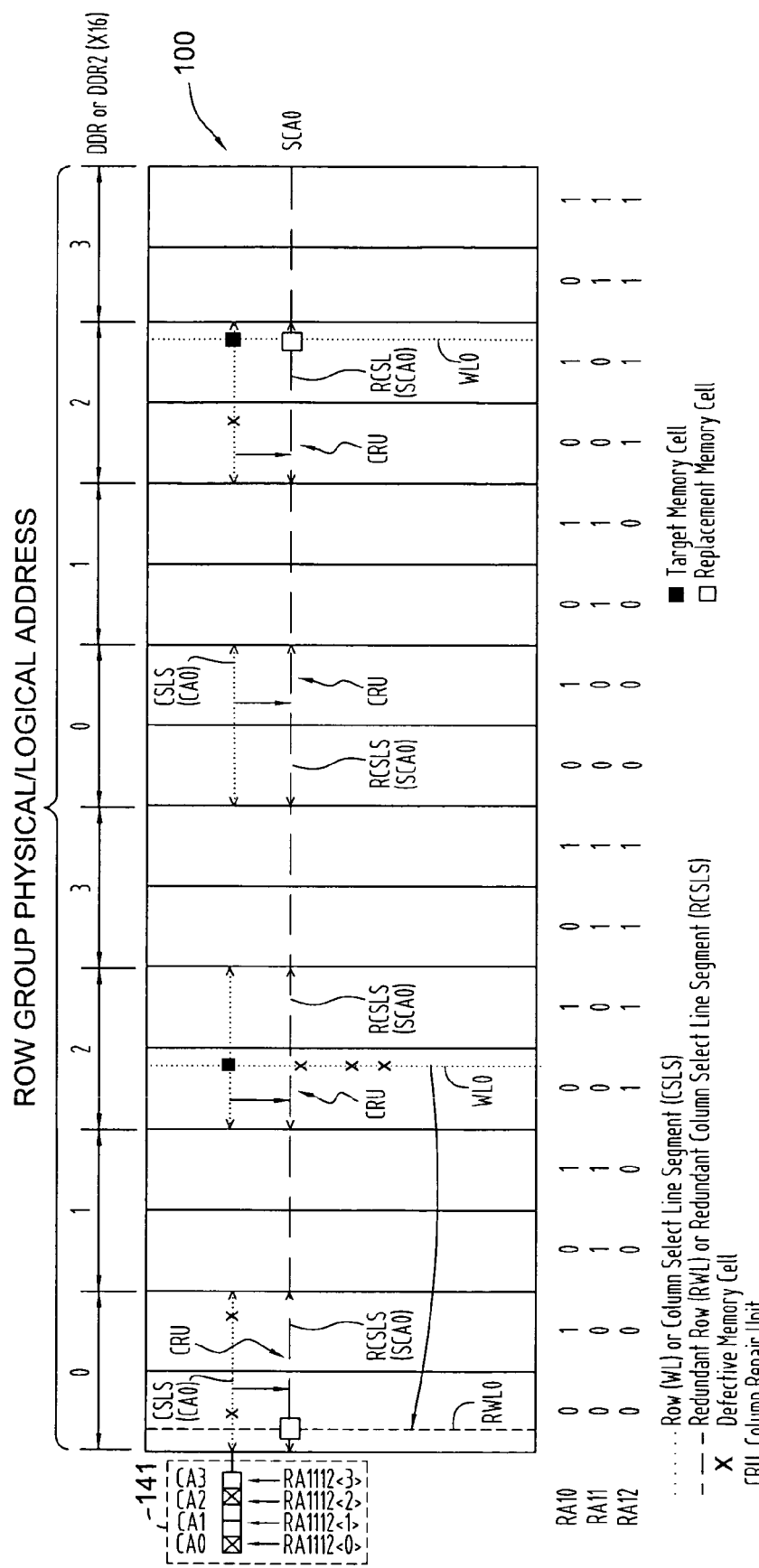

FIG. 10 is a modification of the embodiment in FIG. 9. FIG. 10 shows a single bad row where two column select line segments CA0 and CA2 respectively located within row groups 0 and 2 contain bad memory cells, and thus need redundancy replacement. In FIG. 10, the target memory cell (■) on the left is replaced in the same manner as FIG. 9. However, the target memory cell (■) on the right is remapped to redundant column select line (SCA0) in row group 2 as shown by replacement memory cell (□) in FIG. 10, because it is located in a bad column select line segment with the address CA2.

Figure 11:
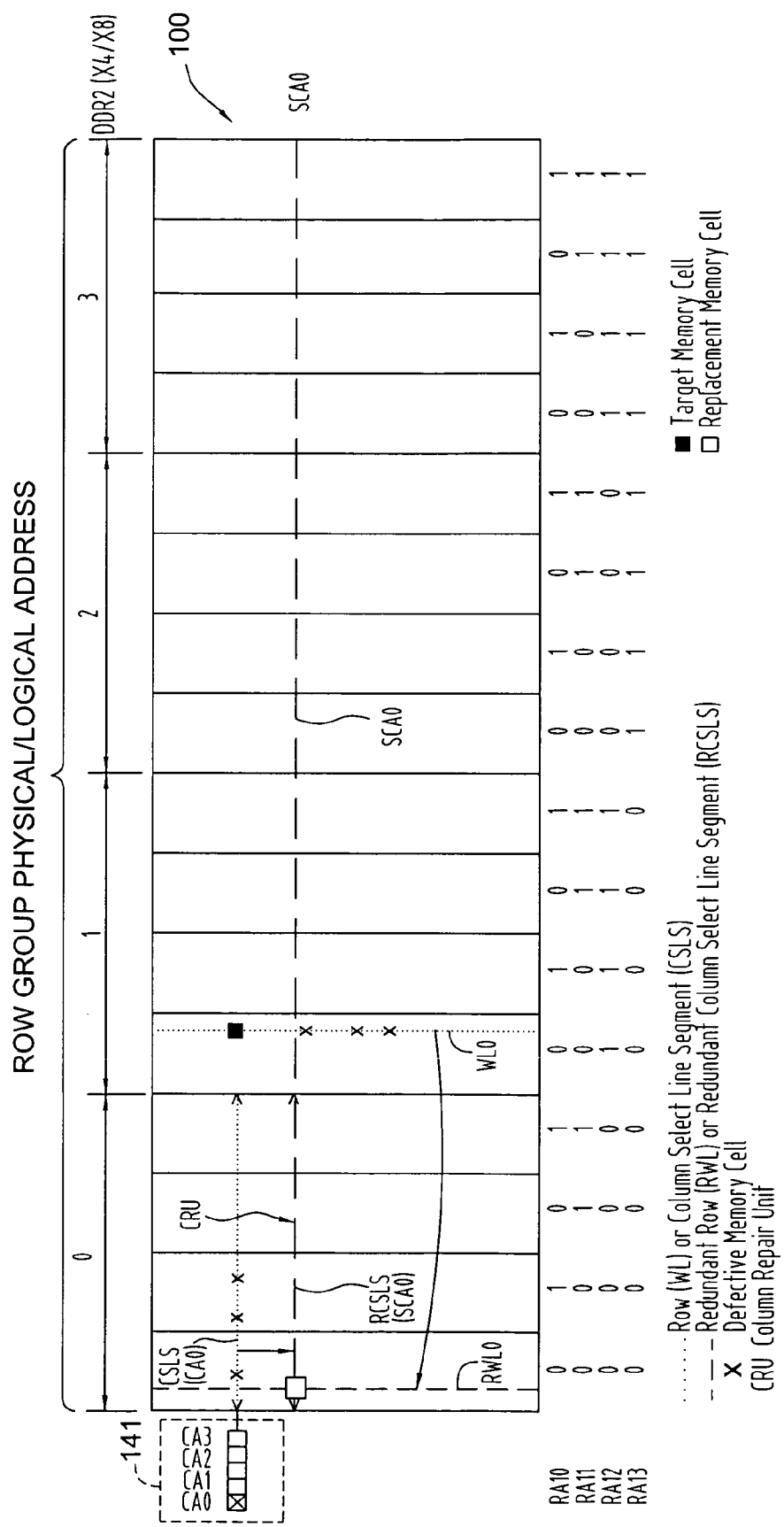

FIG. 11 includes a view of row and column select segment line replacement for DDR2 DRAM operating in X4 or X8 mode. The row and column select line replace in FIG. 10 resembles that shown in the left half of FIG. 9 for the target memory cell (■). The types of operating modes shown in FIG. 11 addresses one row (e.g., WL0), and thus only one row replacement is necessary. When the row (e.g. WL0) is addressed that contains bad or faulty memory cells, the target memory cell (■) in row group 1 is replaced or remapped with the replacement memory cell (□) in row group 0. Further, the memory array 100 contains four CLS segments that are addressed individually. Therefore, replacement of a bad CLS occurs singularly and not in pairs as shown in FIG. 9. The four CLS segments can be addresses RA12 and RA13 as shown at the bottom of FIG. 9. For example the CLS segment 0, which is addressed by CA0, can be addressed by address where RA12=0 and RA13=0. The structures shown in FIG. 1 can be used with the operation modes shown in FIG. 9 where the structure for RA11 and RA12 of FIG. 1 is replace with structure for RA12 and RA13.

In view of the above, it will be seen that the embodiments of the invention are achieved and other advantageous results attained. As various changes could be made in the above constructions without departing from the scope of the flexible redundancy replacement scheme for memory described in this application, it is intended that all matter contained in the above description or shown in the accompanying drawings shall be interpreted as illustrative and not in a limiting sense.

What is claimed is:

1. A method for replacing a faulty memory cell with a redundant memory cell in a memory array based on row groups and column select line segments, where the memory array contains a defective row with a faulty memory cell and a defective column select line segment with a faulty memory cell, the method comprising:

obtaining a row group physical address identifying the row group that includes a redundant row for replacing the defective row from a row group logical address identifying the row group that includes the defective row, the row group including the defective row being different than the row group including the redundant row, remapping the defective row to the redundant row based on the row group logical address, and remapping the defective column select line segment to a redundant column select line segment based on the row group physical address.

2. The method for repairing a faulty memory cell with a redundant memory cell according to claim 1, wherein the remapping of the defective row includes comparing the row group logical address with stored addresses identifying faulty memory cells by a row group address.

3. The method for repairing a faulty memory cell with a redundant memory cell according to claim 1, wherein the remapping of the defective column select line includes comparing the address of the defective column select line segment with stored addresses identifying faulty memory cells by a column select line segment address.

4. The method for repairing a faulty memory cell with a redundant memory cell according to claim 1, wherein the remapping of the column select line segment includes a column depth of the memory array selected by a multiplexer.

5. The method for repairing a faulty memory cell with a redundant memory cell according to claim 1, further comprising:

a row address latch receiving a memory address from an address bus;

a decoder receiving a row group address from the row address latch and supplying the row group logical address to a multiplexer;

a redundancy circuit receiving the memory address from the row address latch and supplying the row group physical address to the multiplexer;

the multiplexer selecting one of the row group logical or physical address based on redundancy and supplying a column select line segment address to the column select line repair circuit; and the column select line repair circuit performing column select line segment repair based upon the column select line segment address received from the multiplexer.

* * * * *